United States Patent
Ramaswamy et al.

(10) Patent No.: US 8,772,841 B2
(45) Date of Patent: Jul. 8, 2014

(54) REACTIVE METAL IMPLATED OXIDE BASED MEMORY

(75) Inventors: D.V. Nirmal Ramaswamy, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 13/616,307

(22) Filed: Sep. 14, 2012

(65) Prior Publication Data

US 2013/0015422 A1   Jan. 17, 2013

Related U.S. Application Data

(62) Division of application No. 12/888,219, filed on Sep. 22, 2010, now Pat. No. 8,313,996.

(51) Int. Cl.
| | |
|---|---|
| *H01L 29/66* | (2006.01) |
| *H01L 29/94* | (2006.01) |
| *H01L 21/70* | (2006.01) |
| *H01L 27/108* | (2006.01) |

(52) U.S. Cl.
USPC ........... 257/260; 257/261; 257/296; 257/390; 257/314; 257/E21.613; 257/E21.632; 257/E21.646; 257/E21.661; 257/E21.665

(58) Field of Classification Search
None
See application file for complete search history.

(56) References Cited

U.S. PATENT DOCUMENTS

| | | | |
|---|---|---|---|
| 6,979,858 B2 | 12/2005 | Saito et al. | |
| 8,003,511 B2 | 8/2011 | Rinerson et al. | |
| 2005/0145910 A1* | 7/2005 | Tamai et al. | 257/296 |
| 2006/0088974 A1 | 4/2006 | Zhuang et al. | |
| 2007/0120124 A1 | 5/2007 | Chen et al. | |
| 2008/0121864 A1 | 5/2008 | Seo et al. | |
| 2008/0164568 A1 | 7/2008 | Lee et al. | |
| 2009/0286350 A1* | 11/2009 | Lam et al. | 438/102 |
| 2010/0133496 A1 | 6/2010 | Lee et al. | |

* cited by examiner

*Primary Examiner* — Mohsen Ahmadi
(74) *Attorney, Agent, or Firm* — Brooks, Cameron & Huebsch, PLLC

(57) ABSTRACT

Methods, devices, and systems associated with oxide based memory can include a method of forming an oxide based memory cell. Forming an oxide based memory cell can include forming a first conductive element, forming an oxide over the first conductive element, implanting a reactive metal into the oxide, and forming a second conductive element over the oxide.

17 Claims, 4 Drawing Sheets

REACTIVE METAL IMPLATED OXIDE BASED MEMORY

PRIORITY APPLICATION INFORMATION

This application is a Divisional of U.S. application Ser. No. 12/888,219, filed Sep. 22, 2010, which is incorporated herein by reference.

TECHNICAL FIELD

The present disclosure relates generally to semiconductor memory devices and methods, and more particularly, to reactive metal implanted oxide based memory devices and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistive (e.g., resistance variable) memory, among others. Types of resistive memory include programmable conductor memory, phase change random access memory (PCRAM), and resistive random access memory (RRAM), among others.

Memory devices are utilized as non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices may include a number of memory cells arranged in a matrix (e.g., array). For example, an access device, such as a diode, a field effect transistor (FET), or bipolar junction transistor (BJT), for a memory cell may be coupled to an access line (e.g., word line) forming a "row" of the array. Each memory cell may be coupled to a data line (e.g., bit line) in a "column" of the array. In this manner, the access device of a memory cell may be accessed through a row decoder activating a row of memory cells by selecting the word line coupled to their gates. The programmed state of a selected memory cell may be determined (e.g., sensed) by causing different currents, to flow in the memory cell depending on the resistance associated with a programmed state for a particular memory cell.

Memory cells may be programmed (e.g., written) to a desired state. That is, one of a number of programmed states (e.g., resistance levels) can be set for a memory cell. For example, a single level cell (SLC) can represent one of two logic states (e.g., 1 or 0). Resistive memory cells can also be programmed to one of more than two programmed states, such as to represent more than two binary digits (e.g., 1111, 0111, 0011, 1011, 1001, 0001, 0101, 1101, 1100, 0100, 0000, 1000, 1010, 0010, 0110, or 1110). Such cells may be referred to as multi state memory cells, multi-digit cells, or multilevel cells (MLCs).

Oxide based memory devices such as RRAM may store data by varying the resistance level of a resistive memory element. Data may be programmed to a selected RRAM cell by applying sources of energy, such as positive or negative electrical pulses (e.g., positive or negative voltage or current pulses) to a particular resistive memory element for a predetermined duration. RRAM cells may be programmed to a number of resistance levels by application of voltages or currents of various magnitudes, polarities, and durations.

DETAILED DESCRIPTION

Figure 1:
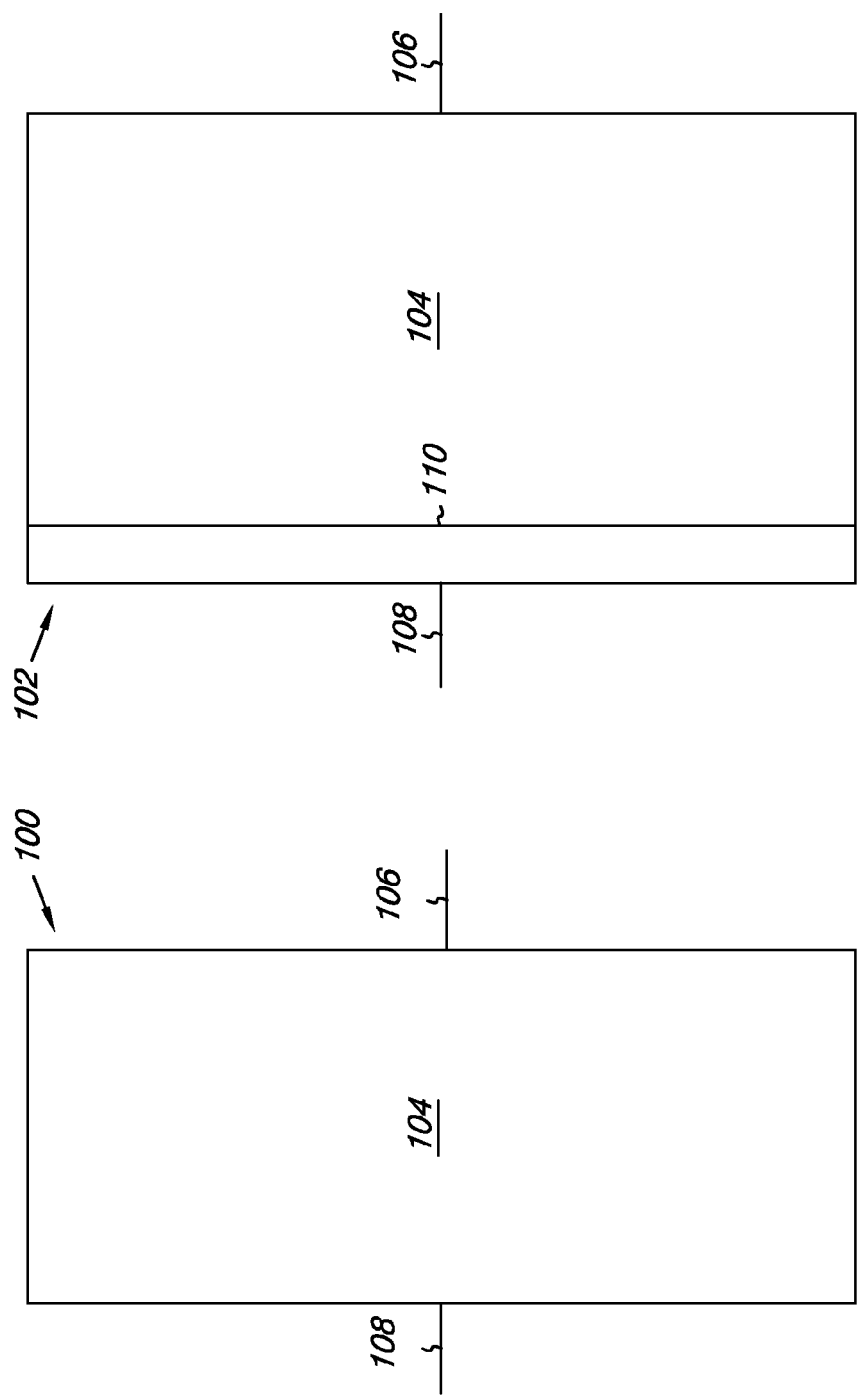
FIG. 1 illustrates a cross-sectional view of a portion of an oxide based memory cell in different operating conditions according to some previous approaches.

Methods, devices, and systems associated with oxide based memory can include a method of forming an oxide based memory cell. Forming an oxide based memory cell can include forming a first conductive element, forming an oxide over the first conductive element, implanting a reactive metal into the oxide, and forming a second conductive element over the oxide.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 204 may reference element "04" in FIG. 2, and a similar element may be referenced as 304 in FIG. 3. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

FIG. 1 illustrates a cross-sectional view of a portion of an oxide based memory cell in different operating conditions according to some previous approaches. An oxide based memory cell 100 can include a first oxide 104 (e.g., an oxygen source) between two conductive elements (e.g., a first conductive element 106 and a second conductive element 108). Oxide based memory cells can be used in a number of electrical devices and can further include a second oxide 110 between the two conductive elements (e.g., electrodes) as illustrated for the memory cell 102.

Some models suggest that an ability for oxide-based memory cells to switch resistance is due to formation and/or dissolution of the second oxide 110 at the interface between the first oxide 104 and one of the electrodes 108 (e.g., a gate electrode formed of a material that is reactive with respect to the first oxide 104). In such scenarios, conduction of electricity through the second oxide 110 can be modulated via application of relatively positive or negative voltages across the first electrode 106 and the second electrode 108 to result in the memory effect. Assuming that oxygen from the first oxide 104 is relatively unlimited with respect to reactive material from one of the electrodes 108, the thickness of the second oxide 110 can be limited by a self-limiting reaction between the oxygen and the reactive material at the interface. Accordingly, a program/erase window for the memory cell 102 can be limited by the same mechanism.

Figure 2:
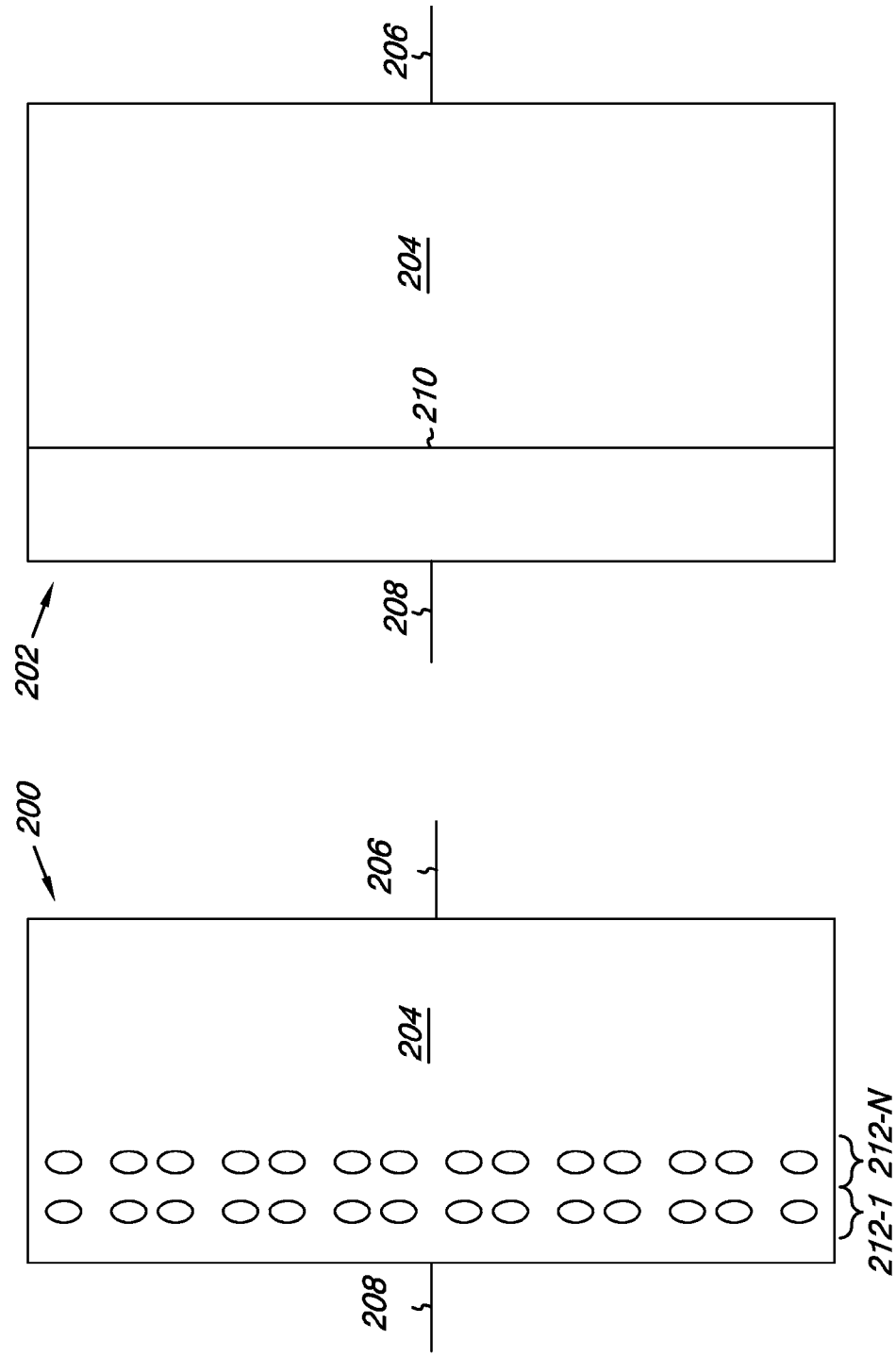
FIG. 2 illustrates a cross-sectional view of a portion of an oxide based memory cell in different operating conditions in accordance with one or more embodiments of the present disclosure.

FIG. 2 illustrates a cross-sectional view of a portion of an oxide based memory cell in different operating conditions in accordance with one or more embodiments of the present disclosure. The memory cell 200 is illustrated without having been programmed or erased. The memory cell 202 is illustrated in a programmed state (e.g., after having a voltage applied thereto).

An oxide based memory cell 200 can include a first oxide 204 (e.g., an oxygen source) between two conductive elements (e.g., a first conductive element 206 and a second conductive element 208). According to one or more embodiments of the present disclosure, the first oxide 204 can be implanted with one or more materials 212-1, ..., 212-N (e.g., a metal that is reactive with respect to the first oxide 204 to form a metal second oxide 210). Implanting the first oxide with the reactive material can provide additional metal at the interface between the first oxide 204 and one of the electrodes 208. The amount and/or location of the one or more materials 212-1, ..., 212-N implanted into the first oxide 204 can be controlled to engineer a tunnel barrier between the first oxide and the electrode 208 in order to provide a reliable program/erase window for the memory cell 200. The tunnel barrier can form an oxygen ion trapping area for a memory cell. In some embodiments, the tunnel barrier can have a size in the range of approximately two (2) to one hundred (100) nanometers (nm) in thickness.

Implanting the first oxide 204 with reactive materials can increase a thickness of a resulting second oxide 210 with respect to a second oxide that would otherwise be formed if the first oxide had not been implanted with reactive materials (e.g., second oxide 110 as illustrated in FIG. 1). The thickness of the second oxide 210 refers to a length of the second oxide 210 in a direction between the first conductive element 206 and the second conductive element 208. The second oxide 210 (e.g., a sub-oxide) can be formed by reaction of those of the one or more implanted materials 212-1, ..., 212-N that are reactive with the first oxide 204, the first oxide 204, and/or the second conductive element 208 (e.g., where the second conductive element is also reactive with the first oxide 204) upon biasing the second conductive element 208 with a positive voltage relative to the first conductive element 206 to promote oxygen ion movement from the first oxide 204 to the second oxide 210 as described in more detail with respect to FIG. 3.

In addition to providing for a thicker second oxide 210, implanting one or more reactive materials can provide for an enhanced tunnel barrier between the first oxide 204 and the second conductive element 208 with respect to a second oxide that would otherwise be formed if the first oxide had not been implanted with reactive materials. An enhanced tunnel barrier can include a graded tunnel barrier, as described herein, and/ or a tunnel barrier having a different activation energy for oxygen ion diffusion with respect to a tunnel barrier that would be formed without implantation of the one or more reactive materials.

Implanting (e.g., ion implantation), as used herein, refers to a process by which ions of one or more materials 212-1, ..., 212-N (e.g., a metal) are implanted into a first oxide 204. Implantation can result in both a chemical and physical change to the first oxide 204 (e.g., the first oxide 204 can be damaged by the implantation). Some examples of implantation methods can include plasma-immersion ion implantation, gas cluster ion beam (GCIB), and others to help control precise placement of the atoms in the oxide 204. As used herein, implantation does not include semiconductor doping. In contrast, semiconductor doping (e.g., n-type or p-type doping) can include the introduction of dopants into a semiconductor to change its electrical properties (e.g., conduction). With respect to FIG. 2, implantation of one or more materials 212-1, ..., 212-N can result in the formation of a second oxide 210 that is chemically and physically distinct from the first oxide 204. For an example embodiment where the first oxide 204 comprises a perovskite metal oxide (PCMO), the first oxide 204 can be implanted with a metal 212-1 (e.g., titanium) to form a metal second oxide 210 (e.g, TiOx).

In some embodiments, the first conductive element 206 can be formed of a first material and the second conductive element 208 can be formed of a second material different than the first material. In some embodiments, the second material can be reactive with respect to the first oxide 204, however, in various embodiments, the second material can be nonreactive with respect to the first oxide 204 (e.g., where a sufficient amount of the one or more materials 212-1, ..., 212-N are implanted to react with the first oxide to provide for a desired tunnel barrier without reaction of the second material with the first oxide 204). In some embodiments, the second material can be the same as one of the one or more materials 212-1, ..., 212-N. The one or more materials 212-1, ..., 212-N can be implanted into a portion of the first oxide 204 that is proximal to the second conductive element 208 and distal to the first conductive element 206.

Some embodiments can include implanting only one material 212-1, ..., 212-N into the first oxide 204. Other embodiments can include implanting more than one material 212-1, ..., 212-N into the first oxide 204. For those embodiments including more than one material, 212-1, ..., 212-N, different materials 212-1, ..., 212-N can have different activation energies for oxygen ion diffusion. Such embodiments can be beneficial for providing a graded tunnel barrier between the first oxide 204 and the electrode 208. For example, a graded tunnel barrier can be formed from a first material 212-1 and a second material 212-N. The first portion of the graded tunnel barrier, which includes the first material 212-1, can provide an activation energy for oxygen ion diffusion that is higher than the second material's activation energy for oxygen ion diffusion and is more likely to retain oxygen ions that enter the first material 212-1 once the biasing voltage is no longer applied to the memory cell, as is described in more detail with respect to FIG. 3. The second portion of the tunnel barrier, which includes the second material 212-N, can provide an activation energy for oxygen ion diffusion that is lower than first material's activation energy for oxygen ion diffusion and allows the oxygen ions to move from the first oxide 204 to and through the second portion of tunnel barrier at a lower biasing voltage than the first portion of the tunnel barrier, which includes the first material 212-1. The combination of the first material and the second material in the tunnel barrier provide for the combined properties of ease of transfer of the oxygen ions to the tunnel barrier and retention of the oxygen ions in the tunnel barrier. The proportions of the oxides forming the tunnel barrier can be modified to have desired operating characteristics, such as a desired programming or erase current. In one or more embodiments that include implanting more than one material 212-1, . . . , 212-N, one or more of the materials 212-1, . . . , 212-N can be nonreactive with respect to the first oxide 204.

A first oxide 204 of an oxide based memory cell 202 that is implanted with one or more materials 212-1, . . . , 212-N can further include a second oxide 210 between the first conductive element 206 and the second conductive element 208. The second oxide 210 can include a combination of the one or more implanted materials 212-1, . . . , 212-N and the first oxide 204 formed by reaction of the one or more implanted materials 212-1, . . . , 212-N with the first oxide 204 upon application of a potential (e.g., a positive voltage) across the second conductive element 208 and the first conductive element 206, as described in more detail with respect to FIG. 3. The second oxide 210 can provide a tunnel barrier and/or a graded tunnel barrier between the first oxide 204 and the second conductive element 208.

Figure 3:
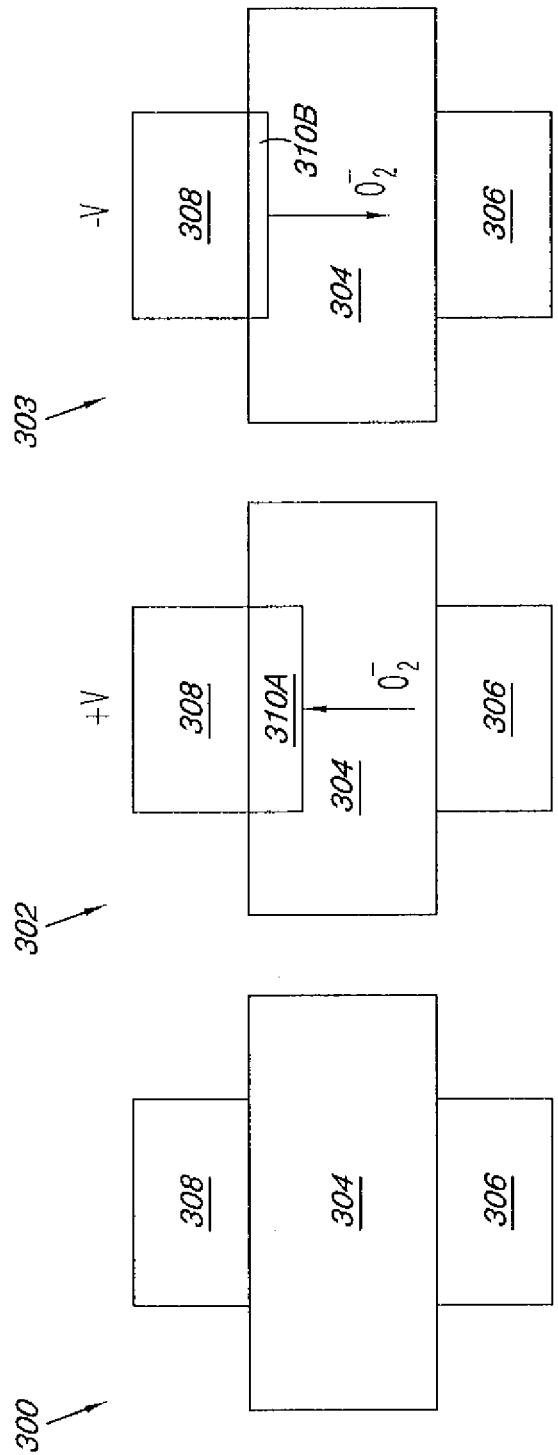
FIG. 3 illustrates a cross-sectional view of a portion of an oxide based memory cell in different operating conditions in accordance with one or more embodiments of the present disclosure.

FIG. 3 illustrates a cross-sectional view of a portion of an oxide based memory cell in different operating conditions in accordance with one or more embodiments of the present disclosure. The memory cell 300 is illustrated without having been programmed or erased. The memory cell 302 is illustrated in a programmed state (e.g., after having a positive voltage applied thereto). The memory cell 303 is illustrated in an erased state (e.g., after having a negative voltage applied thereto). The memory cells each include a first conductive element 306 and a second conductive element 308. Although not specifically illustrated, the memory cells can be formed over a substrate (e.g., the first conductive element 306 can be formed over a substrate). For example, the substrate can be a silicon substrate or silicon on insulator (SOI) substrate, among others.

In one or more embodiments, the first conductive element 306 can be a suitable metal, such as platinum (Pt), among other metals. The first conductive element 306 can be formed by deposition processes such as, but not limited to, chemical vapor deposition (CVD) and plasma vapor deposition (PVD), etc. The first conductive element 306 can be coupled to circuitry that can provide current to the memory cell for programming, erasing, and/or reading the memory cell.

In one or more embodiments, the first oxide 304 can be formed over the first conductive element 306. The first oxide 304 can be formed of perovskite metal oxide (PCMO), titanium oxide ($TiO_x$) lanthanum calcium manganese oxide (LCMO), strontium titanate (STO), and/or magnesium oxide (MgO), among other suitable oxygen sources. The first oxide 304 (e.g., oxygen source) can provide the source of the oxygen ions that move from the oxygen source to the second oxide (e.g., tunnel barrier) when a biasing voltage is applied to the memory cell that is sufficient to cause the oxygen ions to move from the oxygen source to the tunnel barrier. The first oxide 304 can have a thickness of approximately 20-2000 angstroms (Å).

Although not specifically illustrated in FIG. 3, the first oxide 304 can be implanted with one or more materials (e.g., as illustrated in FIG. 2). At least one of the one or more materials implanted into the first oxide 304 can be reactive with respect to the first oxide 304 to form a second oxide (e.g., a metal oxide) at an interface between the first oxide 304 and the second conductive element 308. In some embodiments, the second conductive element 308 can be formed of a same material as at least one of the one or more materials implanted into the first oxide 304. Some examples of reactive materials that can be implanted into the first oxide 304 include titanium, tantalum, aluminum, hafnium, zirconium, among other metals and combinations thereof. In one or more embodiments, as described herein, more than one material can be implanted into the first oxide 304. Such embodiments can include combinations of reactive materials or a combination of reactive materials with non-reactive materials. An example of a non-reactive material that can be implanted into the first oxide 304 includes argon.

Reaction between material implanted into the first oxide 304 (and/or material from the second conductive element 308) and oxygen ions from the first oxide 304 can create a second oxide 310A (e.g., a metal oxide) of a material such as aluminum oxide ($AlO_x$), silicon dioxide ($SiO_2$), silicon oxynitride (SiON), hafnium silicon oxide ($HfSiO_x$), zirconium silicon oxide ($ZrSiO_x$), zirconium silicon oxynitride (ZrSiON), hafnium oxide ($HfO_x$), zirconium oxide ($ZrO_x$), titanium oxide ($TiO_2$), hafnium zirconium oxide ($HfZrO_x$), hafnium titanium oxide ($HfTiO_x$), zirconium titanium oxide ($ZrTiO_x$), and/or strontium oxide (SrO), among other materials.

The second conductive element 308 can be formed over the first oxide 304. The second conductive element 308 can be formed by deposition processes such as, but not limited to, chemical vapor deposition (CVD) and/or plasma vapor deposition (PVD), etc. The second conductive element 308 can be coupled to circuitry that can provide current to the memory cell for programming, erasing, and/or reading the memory cell.

Oxide based memory cells can operate by applying a positive voltage across the first conductive element 306 and the second conductive element 308 (e.g., the electrodes) of the memory cell 302 to cause oxygen ions from the first oxide 304 to create and/or increase a size of a second oxide 310A (e.g., move to the tunnel barrier). A negative voltage can be applied across the electrodes of the memory cell 303 to cause oxygen ions to remove and/or dissolve a size of the second oxide 310B (e.g., move from the tunnel barrier to the first oxide 304). The resistivity of the memory cell is dependent on the oxygen ion location and changes as the location of the oxygen ions changes, either in the second oxide, in the first oxide 304, and/or in a portion of each. Therefore, the state of the memory cell can change depending on the location of the oxygen ions and the state of the cell can be read by applying a read voltage across the electrodes of the memory cell.

Although not specifically illustrated in FIG. 3, an access device can be coupled in series with a memory cell. The memory cell can be coupled to data line (e.g., bit line) and source line. The access device can serve as a switch for enabling and disabling current flow through the memory cell. The access device can be, for example, a transistor, such as a field effect transistor (FET) or bipolar junction transistor (BJT), with a gate coupled to an access line (e.g., a word line). Thus, when the word line is energized, the access device can be turned on, thereby completing the circuit between the source line and the bit line through the memory cell.

The bit line and source line can be coupled to logic for sensing (e.g., reading) from, and logic for programming (e.g., writing) a memory cell. For example, a read/write control multiplexer can have an output coupled to the bit line. The read/write control multiplexer can be controlled by a read/write control logic line to select between a first input coupled to a bipolar write pulse generator, and a second input coupled to read sensing logic. The magnitude, polarity, and/or duration of voltage or current applied to the memory cell for programming can be controlled by application thereof between the bit line and the source line associated with the memory cell.

In a number of embodiments, during a write operation, a bias generator can establish, through the bipolar write pulse generator, a write bias voltage potential difference between the bit line and the source line (e.g., a fixed voltage) associated with the memory cell. The write bias voltage can cause a particular magnitude of current to flow through the memory cell, which can change the resistance of the memory cell to a particular resistance. The particular resistance can correspond to the programmed state of the memory cell (e.g., programmed as illustrated by memory cell 302 or erased as illustrated by memory cell 303). Although not specifically illustrated in FIG. 3, a memory cell can be programmed to a number of intermediate programmed states for multibit operation (e.g., multiple resistance states).

In a number of embodiments, during a read operation, the bias generator can establish, through read sensing logic, a read bias voltage potential difference between the bit line and the source line (e.g., a fixed voltage) associated with the memory cell. The read bias voltage can cause a particular magnitude of current to flow corresponding to the resistance of the memory cell. For example, the greater the resistance of the memory cell, the smaller the current that flows for a given read bias voltage. The amount of current flowing through the memory cell during a read operation (or a voltage proportional thereto) can be sensed by read sensing logic (e.g., a sense amp can compare a circuit-derived input to a reference input that corresponds to a boundary condition between two programmed states) to determine an output corresponding to the programmed state represented by the present resistance of the memory cell.

In a number of embodiments, a read current can be applied through the memory cell causing a corresponding voltage to be developed, which can be sensed and compared to a reference voltage. From the comparison, the resistance of the memory cell can be determined.

Although the discussion above describes a particular read and write logic arrangement, one of skill in the art will appreciate that a number of embodiments of the present disclosure can be implemented using other configurations of logic for switching and/or programming a memory cell. Further, oxide-based memory devices can include additional elements and/or circuitry, as will be appreciated by one of skill in the art.

Figure 4:
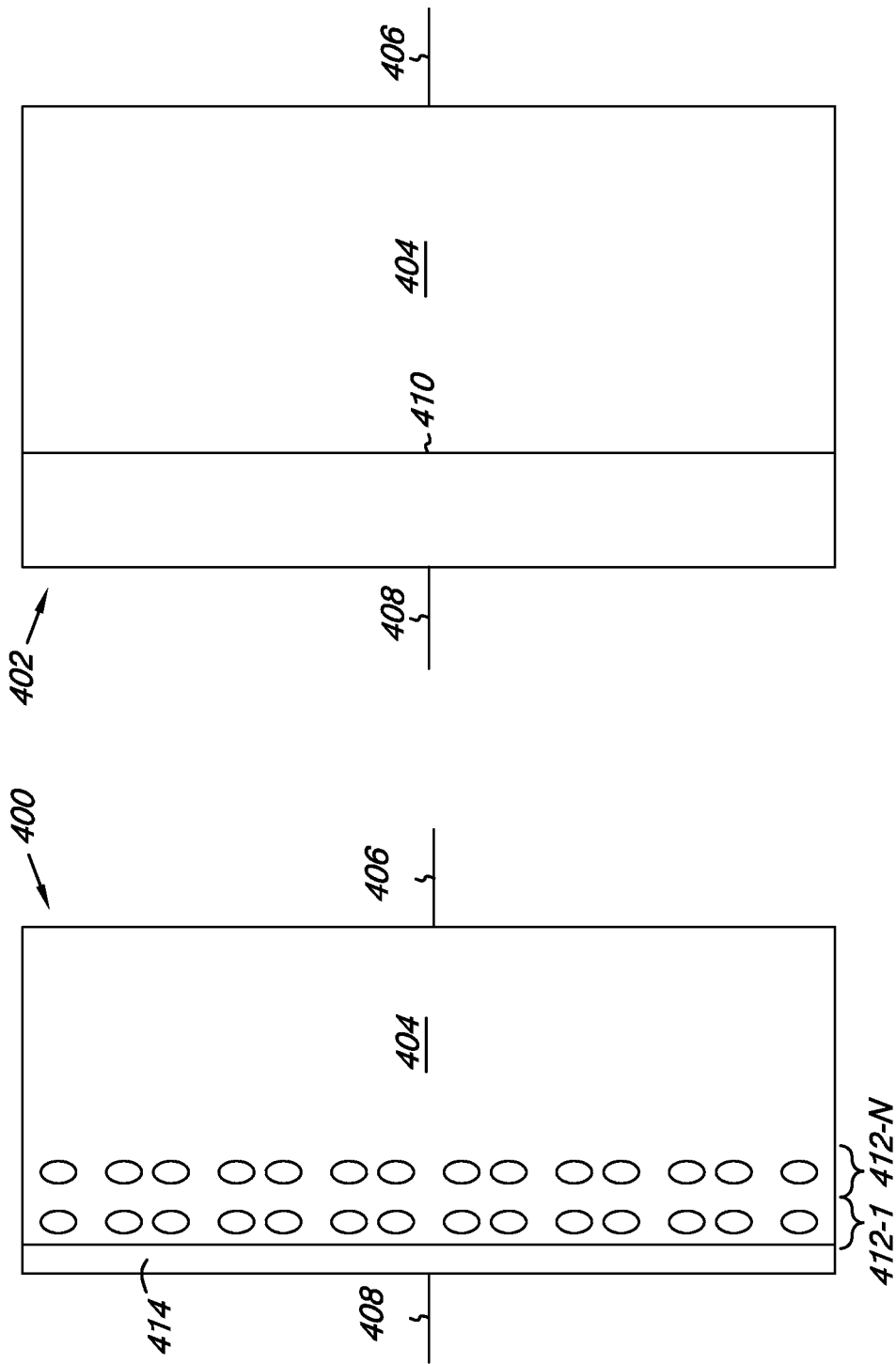
FIG. 4 illustrates a cross-sectional view of a portion of an oxide based memory cell in different operating conditions in accordance with one or more embodiments of the present disclosure.

FIG. 4 illustrates a cross-sectional view of a portion of an oxide based memory cell in different operating conditions in accordance with one or more embodiments of the present disclosure. The memory cell 400 is illustrated without having been programmed or erased. The memory cell 402 is illustrated in a programmed state (e.g., after having a voltage applied thereto).

An oxide based memory cell 400 can include a first oxide 404 (e.g., an oxygen source) between two conductive elements (e.g., a first conductive element 406 and a second conductive element 408). According to one or more embodiments of the present disclosure, the first oxide 404 can be implanted with one or more materials 412-1, ..., 412-N. Implanting the first oxide with the reactive material can provide additional metal at the interface between the first oxide 404 and one of the electrodes 208. The amount and/or location of the one or more materials 412-1, ..., 412-N implanted into the first oxide 404 can be controlled to engineer a tunnel barrier between the first oxide and the electrode 408 in order to provide a reliable program/erase window for the memory cell 400. The tunnel barrier can form an oxygen ion trapping area for a memory cell.

The memory cell 400 can be analogous to the memory cell 200 illustrated in FIG. 2, with an additional portion 414 of the memory cell 400 formed over the first oxide 404, which has been implanted with one or more materials 412-1, ..., 412-N. The additional portion 414 can include a reactive material (e.g., metal) formed (e.g., deposited) over the first oxide 404 (e.g., a portion of the first oxide 404 that has been implanted with one or more materials 412-1, ..., 412-N). In one or more embodiments, the additional portion 414 of the memory cell 400 can be formed of a material that is the same as one of the one or more materials 412-1, ..., 412-N that are implanted into the first oxide 404. The second conductive element 408 can be formed over the additional portion 414 of the memory cell 400.

Implanting the first oxide 404 with one or more reactive materials in addition to forming an additional portion 414 of the memory cell 400 with a material that is reactive with respect to the first oxide 404 can further increase a thickness of a resulting second oxide 410 with respect to a second oxide that would otherwise be formed if either or both of the additional portion 414 of the memory cell 400 had not been formed or if the first oxide had not been implanted with reactive materials (e.g., second oxide 110 as illustrated in FIG. 1). Forming the additional portion 414 of the memory cell 400 with a metal can provide additional metal to react with oxygen ions from the first oxide 404 (e.g., oxygen source) upon biasing the second conductive element 208 with a positive voltage relative to the first conductive element 206, as described herein.

In addition to providing for a thicker second oxide 410, forming the additional portion 414 of the memory cell 400 can provide for an enhanced tunnel barrier between the first oxide 404 and the second conductive element 408 with respect to a second oxide that would otherwise be formed if either or both of the additional portion 414 of the memory cell 400 had not been formed or if the first oxide had not been implanted with reactive materials.

Methods, devices, and systems associated with oxide based memory can include a method of forming an oxide based memory cell. Forming an oxide based memory cell can include forming a first conductive element, forming an oxide over the first conductive element, implanting a reactive metal into the oxide, and forming a second conductive element over the oxide.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An oxide based memory cell, comprising:
   a first conductive element;
   a second conductive element; and
   an oxide between the first conductive element and the second conductive element, wherein the oxide is implanted with a metal, between the first conductive element and the second conductive element, that is reactive with respect to the oxide;
   wherein the oxide is implanted with a first metal that is reactive with respect to the oxide and a second metal that is reactive with respect to the oxide, and wherein the first metal and the second metal include different activation energies for oxygen ion diffusion so as to form a portion of the memory cell over the oxide.

2. The memory cell of claim 1, wherein the second conductive element comprises a metal that is reactive with respect to the oxide.

3. The memory cell of claim 1, wherein the second conductive element comprises a same metal as the metal implanted into the oxide.

4. The memory cell of claim 1, wherein the oxide between the first conductive element and the second conductive element comprises a first oxide; and
   the memory cell includes a metal second oxide between the second conductive element and the first oxide, wherein the metal second oxide comprises a combination of the metal and the first oxide and provides a tunnel barrier between the first oxide and the second conductive element.

5. The memory cell of claim 1, wherein:
   the first conductive element comprises a platinum electrode;
   the oxide comprises a perovskite metal oxide;
   the reactive metal comprises titanium; and
   the second conductive element comprises a titanium electrode.

6. The memory cell of claim 1, wherein the memory cell includes a metal, which is reactive with respect to the oxide, between the oxide and the second conductive element.

7. The memory cell of claim 1, wherein the memory cell includes a sub-oxide in the oxide proximal to the second conductive element in response to the second conductive element being biased with a positive voltage relative to the first conductive element.

8. An oxide based memory cell, comprising:
   a first conductive element;
   a second conductive element;
   an oxide between the first conductive element and the second conductive element, wherein the oxide is implanted with a first metal that is reactive with respect to the oxide and
   a second metal, which is reactive with respect to the oxide, between the oxide and the second conductive element;
   wherein the memory cell includes a graded tunnel barrier in a portion of the oxide proximal to the second metal, wherein the graded tunnel barrier includes a first portion having first activation energy for oxygen ion diffusion and a second portion having a second activation energy for oxygen ion diffusion different than the first activation energy.

9. The memory cell of claim 8, wherein the second metal is the same metal as the first metal.

10. The memory cell of claim 8, wherein the oxide is implanted with a third metal that is reactive with respect to the oxide.

11. The memory cell of claim 8, wherein the first portion of the graded tunnel barrier corresponds to the first metal and wherein the second portion of the graded tunnel barrier corresponds to the third metal.

12. The memory cell of claim 8, wherein the memory cell includes a sub-oxide in the oxide proximal to the second metal in response to the second conductive element being biased with a positive voltage relative to the first conductive element.

13. An oxide based memory cell, comprising:
    a first conductive element;
    a second conductive element;
    an oxide between the first conductive element and the second conductive element; and
    a graded tunnel barrier in a portion of the oxide proximal to the second conductive element, wherein the graded tunnel barrier includes a first portion having a first activation energy for oxygen ion diffusion and a second portion having a second activation energy for oxygen ion diffusion different than the first activation energy;
    wherein the memory cell includes a sub-oxide in the oxide proximal to the second conductive element in response to the second conductive element being biased with a positive voltage relative to the first conductive element.

14. The memory cell of claim 13, wherein the first portion of the graded tunnel barrier includes a first reactive metal implanted therein and wherein the second portion of the graded tunnel barrier includes a second reactive metal implanted therein.

15. The memory cell of claim 14, wherein the first reactive metal provides the first activation energy for ion diffusion and wherein the second reactive metal provides the second activation energy for ion diffusion.

16. The memory cell of claim 13, wherein the memory cell includes a metal, which is reactive with respect to the oxide, between the oxide and the second conductive element.

17. The memory cell of claim 13, wherein the second conductive element comprises a metal that is reactive with respect to the oxide.

* * * * *

UNITED STATES PATENT AND TRADEMARK OFFICE
CERTIFICATE OF CORRECTION

PATENT NO. : 8,772,841 B2  
APPLICATION NO. : 13/616307  
DATED : July 8, 2014  
INVENTOR(S) : D. V. Nirmal Ramaswamy et al.

Page 1 of 1

It is certified that error appears in the above-identified patent and that said Letters Patent is hereby corrected as shown below:

On the title page, item (54), under "Title", and in the Specification, column 1, line 1, delete "IMPLATED" and insert -- IMPLANTED --, therefor.

In the Claims:

In column 10, line 10, in Claim 8, delete "having" and insert -- having a --, therefor.

Signed and Sealed this  
Thirtieth Day of September, 2014

Michelle K. Lee  
*Deputy Director of the United States Patent and Trademark Office*